(12) United States Patent
Lin

(10) Patent No.: US 6,501,136 B1
(45) Date of Patent: *Dec. 31, 2002

(54) HIGH-SPEED MOSFET STRUCTURE FOR ESD PROTECTION

(75) Inventor: Shi-Tron Lin, Taipei (TW)

(73) Assignee: Winbond Electronics Corporation (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/931,342

(22) Filed: Sep. 16, 1997

(51) Int. Cl.$^7$ .......................... H01L 23/62; H01L 29/00
(52) U.S. Cl. ...................... 257/355; 257/356; 257/357; 257/358; 257/546
(58) Field of Search ................................ 257/355, 356, 257/357, 358, 546, 365

(56) References Cited

U.S. PATENT DOCUMENTS

| | | | |
|---|---|---|---|
| 4,005,467 A | * | 1/1977 | Vergnolle ..................... 357/22 |
| 4,462,041 A | * | 7/1984 | Glenn .......................... 357/23 |
| 4,638,187 A | | 1/1987 | Boler et al. |
| 4,725,747 A | | 2/1988 | Stein et al. |
| 4,825,280 A | * | 4/1989 | Chen et al. .................... 357/71 |
| 4,949,139 A | | 8/1990 | Korsh et al. |
| 5,371,395 A | * | 12/1994 | Hawkins ...................... 275/257 |
| 5,477,407 A | * | 12/1995 | Kobayashi et al. ......... 257/355 |
| 5,563,439 A | * | 10/1996 | Chung et al. ............... 257/365 |
| 6,274,896 B1 | * | 8/2001 | Gibson et al. .............. 257/259 |

OTHER PUBLICATIONS

A. Amerasekera, C. Duvvury, "ESD In Silicon Integrated Circuits," Chap. 3.2 & 4.3.2 (1995).

* cited by examiner

Primary Examiner—David Hardy
Assistant Examiner—Jesse A. Fenty
(74) Attorney, Agent, or Firm—Finnegan, Henderson, Farabow, Garrett & Dunner, L.L.P.

(57) ABSTRACT

A multi-gate-finger MOSFET structure positions the gate element over a channel between drain and source diffusion regions, such that the entire structure is within the active region in a substrate. The gate/channel-to-drain and gate/channel-to-source diffusion edges are effectively continuous along the gate/channel layout, so as to cascade the snap-back action to enhance uniform turn on of the entire gate element during an ESD event. In addition, multiple poly-gate extensions are incorporated to reduce the gate resistance, thereby minimizing the propagation delay of the gate signal.

54 Claims, 4 Drawing Sheets

US 6,501,136 B1

HIGH-SPEED MOSFET STRUCTURE FOR ESD PROTECTION

RELATED APPLICATION

This invention is related to U.S. patent application Ser. No. 08/931,343, entitled "A Low Noise, High Current-Drive MOSFET Structure for Uniform Poly-Gate Turn-On During an ESD Event", and U.S. patent application Ser. No. 08/931,594, entitled "A Distributed MOSFET Structure with Enclosed Gate for Improved Transistor Size/Layout Area Ratio and Uniform ESD Triggering", filed on even date herewith for Shi-Tron Lin. The contents of the above-noted applications are incorporated herein by reference.

FIELD OF THE INVENTION

The present invention relates to a MOSFET structure for use in ESD applications. More specifically, the present invention relates to a multi-gate-finger MOSFET structure which enhances high speed, uniform turn-on during an ESD event.

BACKGROUND OF THE INVENTION

An NMOSFET is a very effective ESD protection device. In one application, it is used as the pull down transistor of a CMOS buffer to drive an output voltage for an external device. In this type of application, the gate of the NMOSFET is connected to an input drive signal.

In another common NMOSFET application, the gate is electrically connected to ground, and the NMOSFET is used as an ESD protection device for an input pin or a power bus during an ESD event.

The ESD protective action of an NMOSFET is based on the device's snap-back mechanism, which enables the NMOSFET to conduct a high level of ESD current between its drain and source. This occurs when a strong electric field across the depletion region in the drain substrate junction becomes high enough to begin avalanche breakdown, which in turn causes impact ionization, resulting in the generation of both minority and majority carriers. The minority carriers flow toward the drain contact, and the majority carriers flow toward the substrate/p-well contact, causing a local potential build up across the current path in the p-well substrate. When the local substrate potential is 0.6V higher than an adjacent n+ source potential, the source junction becomes forward biased. The forward biased source junction then injects minority carriers (electrons) into the p-well, and these carriers eventually reach the drain junction to further enhance the impact ionization effect (see "ESD in Silicon Integrated Circuits," by A. Amerasekera and C. Duvvury, Chap. 3, Sec. 1., John Wiley & Sons, 1995). Eventually, the NMOSFET reaches a low impedance (snap-back) state, which enables it to conduct a large amount of ESD current.

To enhance the ESD protection capabilities of a MOSFET device, it is desirable to have a rapid turn on with a high degree of uniformity throughout the device. A known technique for accomplishing these objectives utilizes a multi-gate-finger configuration of reduced length poly gate fingers to speed up the gate signal propagation and to increase the effective gate width. However, in a typical multi-gate-finger NMOS structure, as shown in FIGS. 2a and 2b, not all the poly gate fingers may turn on during an ESD event. That is, when the first few gate fingers reach their snap-back low impedance mode, the drain terminal to source terminal voltage is reduced to a value, called the snap-back voltage, which is less than the trigger voltage of the NMOS device. This has the effect of preventing the remaining gate fingers from being turned on. As a result, only a partial number of the gate fingers are available to absorb the ESD energy. Therefore, the ESD protection provided by the NMOSFET is significantly reduced.

When a MOSFET gate finger is triggered during an ESD event, the entire finger turns on. This is due to the cascading effect of the previously described impact ionization and snapback process along the entire gate finger. It is clearly desirable to turn on all of the gate fingers of a multi-gate-finger MOSFET as simultaneously (uniformly) as possible, for maximum ESD effectiveness.

One prior art technique for improving the uniform turn on of a multi-gate-finger NMOSFET structure uses a gate coupled technique, as shown in FIG. 3, and as described in "ESD in Silicon Integrated Circuits," by A. Amerasekera and C. Duvvury, Chap. 4, Sec. 2., John Wiley & Sons, 1995. In this configuration, the drain is connected to either VDD or the buffer output line, and the gate is coupled to the drain via a capacitor C, and is also connected to ground via a resistor R. The coupling capacitor C and the RC time constant of the circuit cause the gate potential to rise to 1 to 2v during the first 5 to 10 ns of an ESD event. The positive gate voltage reduces the triggering threshold of the NMOSFET, thereby enabling a more uniform turn-on of the gate fingers. This method, however, has the disadvantage of requiring additional layout area for the coupling capacitor C and the resistor R. In addition, since the gate is connected to ground through a resistor R, this configuration is not particularly well suited for an output buffer application.

Another type of prior art multi-gate-finger structure, as described in U.S. Pat. No. 4,462,041, by R. Douglas Glenn, uses a serpentine-like gate structure, of the type depicted in FIG. 4, with a metal line routed along the gate in order to make multiple metal-to-poly-gate contacts. Due to the low resistance of the metal line, the effective gate resistance is greatly reduced, thereby increasing the gate signal propagation speed.

With respect to ESD uniform turn on, however, this prior art serpentine gate structure is essentially equivalent to a conventional multi-gate-finger structure (FIG. 2a), since each gate finger extends beyond the diffusion area and into the field oxide region. Therefore, as described above, this configuration does not provide optimum ESD protection because of its non-uniform turn on characteristics, in that only a partial number of gate fingers may turn on during an ESD event.

Accordingly, it is an object of the present invention to overcome the disadvantages of the prior art with respect to MOSFET ESD protection. That is, it is an object of the present invention to retain the high speed characteristics of the multi-gate-finger structure, while at the same time improving the turn on uniformity during an ESD event.

SUMMARY OF THE INVENTION

In accordance with an illustrative embodiment of the present invention, a multi-gatefinger MOSFET structure is configured to enhance uniform turn on during an ESD event. This is achieved by positioning the active portion of a serpentine-like poly-gate element, overlying a serpentine-like channel layout, between drain and source regions configured in a comb-shaped structure. Importantly, the channel, active gate portion, drain, and source elements are completely contained within an active diffusion area, such that the and channel-to-source diffusion edges are continuous throughout the length of the active gate portion overlying the channel. This enables a cascading snap-back action to develop very rapidly along the active portion of the gate element during the occurrence of an ESD event, thus enhancing the desired uniform turn on of all the MOSFET devices within the diffusion area.

Importantly, multiple poly-gate extensions are provided for connecting the gate to a common gate signal line. This has the effect of minimizing the gate resistance, and thereby maximizing the speed of the MOSFET device.

Thus, the present invention achieves the above stated objectives for a MOSFET device: namely, high speed operation and uniform turn on enhancement during an ESD event. The aforementioned embodiment is more fully described below in conjunction with the following drawings.

BRIEF DESCRIPTION OF THE DRAWINGS

FIG. 2b is a schematic representation of the structure of FIG. 2a.

DETAILED DESCRIPTION OF THE PREFERRED EMBODIMENT

Figure 1:
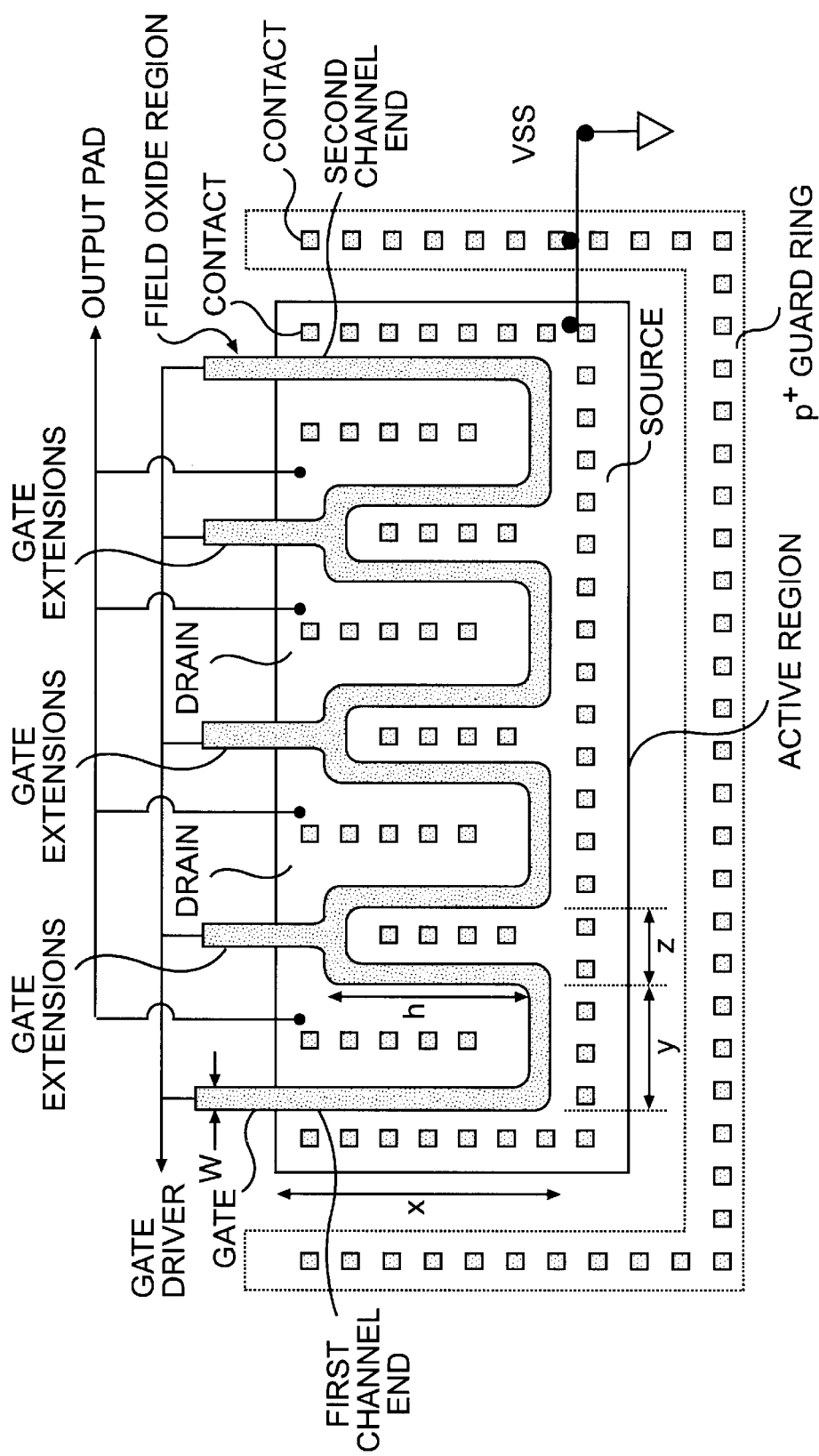
FIG. 1 depicts a first embodiment of the present invention.
Figure 2A:
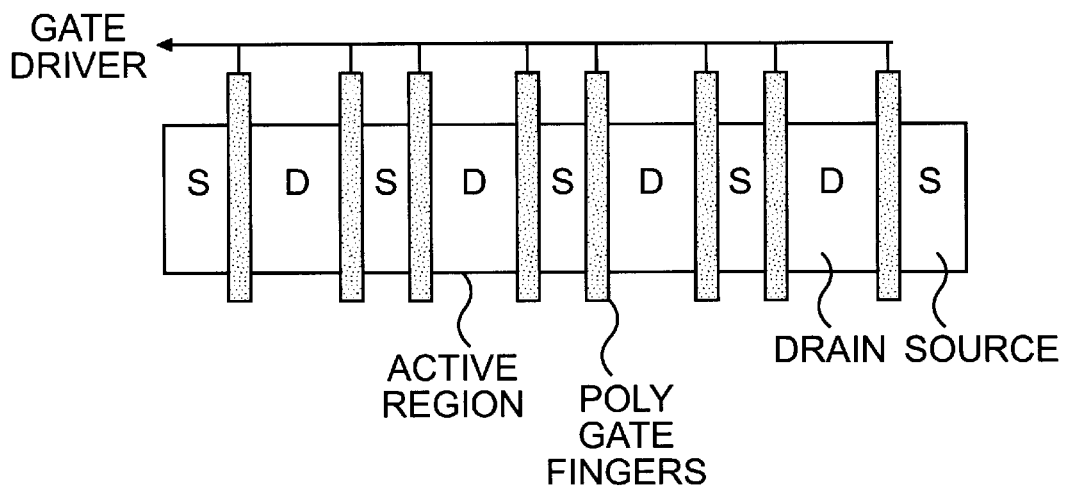
FIG. 2a shows a conventional multi-gate-finger NMOS structure.
Figure 2B:
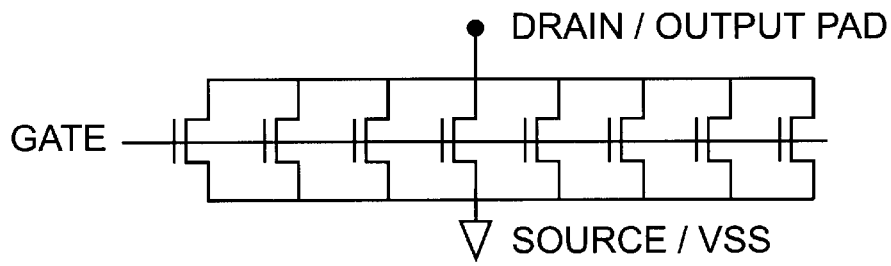
Figure 3:
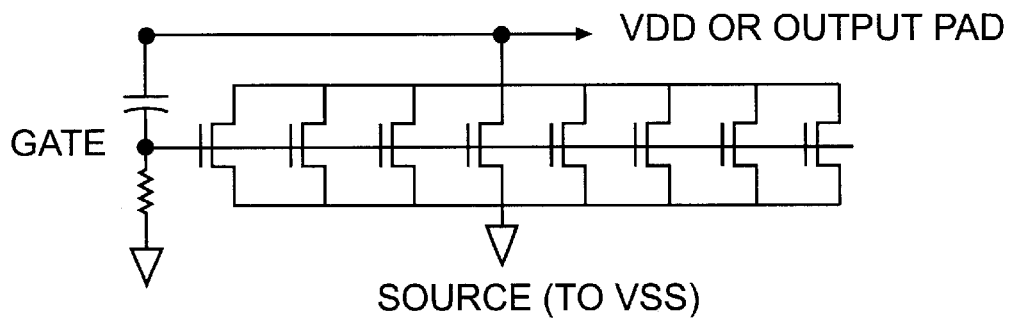
FIG. 3 shows a gate coupled multi-gate-finger NMOS structure.
Figure 4:
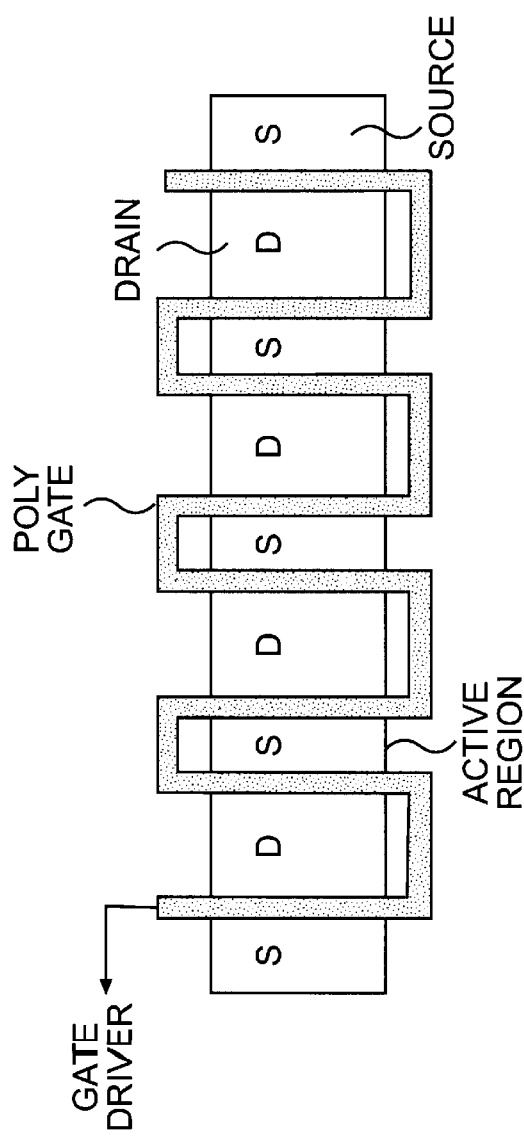
FIG. 4 depicts a prior art serpentine structure.
Figure 5:
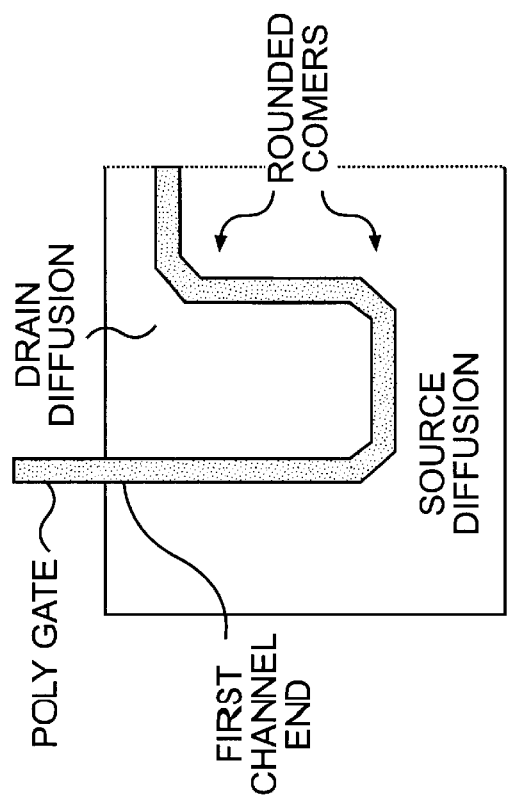
FIG. 5 shows a detail of the structure in FIG. 1.

A first embodiment of the present invention uses a serpentine gate configuration, as depicted in FIG. 1. Unlike the prior art serpentine gate structure (FIG. 4), which divides the diffusion regions into multiple source and drain segments, as represented by FIG. 2a, the present invention contains the serpentine channel and overlying active gate portion (between first and second channel ends) entirely within the active region, as depicted in FIG. 1. As a result, not only are the drain and source regions interdigitated, but the drain and source diffusion regions are also interdigitated in a comb-shaped structure. Thus, the continuous serpentine channel within the active region provides a continuous channel-to-source diffusion edge and a near-continous channel-to-drain diffusion edge (separated by the multiple poly-gate extensions) throughout the active region. However, the gate-to-drain diffusion edge discontinuities do not pervent the cascading snap-back action along the active gate body. In addition, FIG. 1 also shows a gate body having rounded corners, as detailed in FIG. 5, which are used to prevent an electric field "crowding" effect.

The continuous channel-to-source and channel-to-drain diffusion edges enable the local snap-back action to cascade very rapidly along the active gate portion overlying the channel, thereby enhancing the uniform turn on of the entire gate structure during an ESD event. Moreover, the multiple poly-gate extensions are brought out into the field oxide for connection to the gate drive signal, in order to minimize the gate resistance. As a result, the gate signal propagation delay is minimized as well, thus maintaining the desirable high speed characteristic of the MOSFET.

In an illustrative ESD application of the present invention, the MOSFET would be configured as a normally-off ESD protection device. The gate and source would be electrically connected to ground, while the drain would be electrically connected to an input pin or to the VDD power bus for protection during an ESD event. As described above, the inventive channel and overlying gate configuration (contained entirely within the active region) provides a rapid snap-back cascading effect along the entire gate body, which enhances the uniform turn on of all the fingers in the MOSFET, so that the full gate width may be available to pass ESD current, thus improving the effectiveness of the MOSFET for ESD protection.

According to one exemplary embodiment, the layout dimensions of the structure shown in FIG. 1 are as follows:

x=16 um,
y=10 um,
z=2 um, and
h=12 um.

The gate finger width w, which is approximately equal to the channel length, is 0.5 um, and the contact size is 0.5 um square. The drain contact to gate edge spacing is 4.5 um, while the source contact to gate edge spacing is 1 um. This type of structure can be iterated to achieve a total gate channel width of 160 to 500 um.

Figure 6:
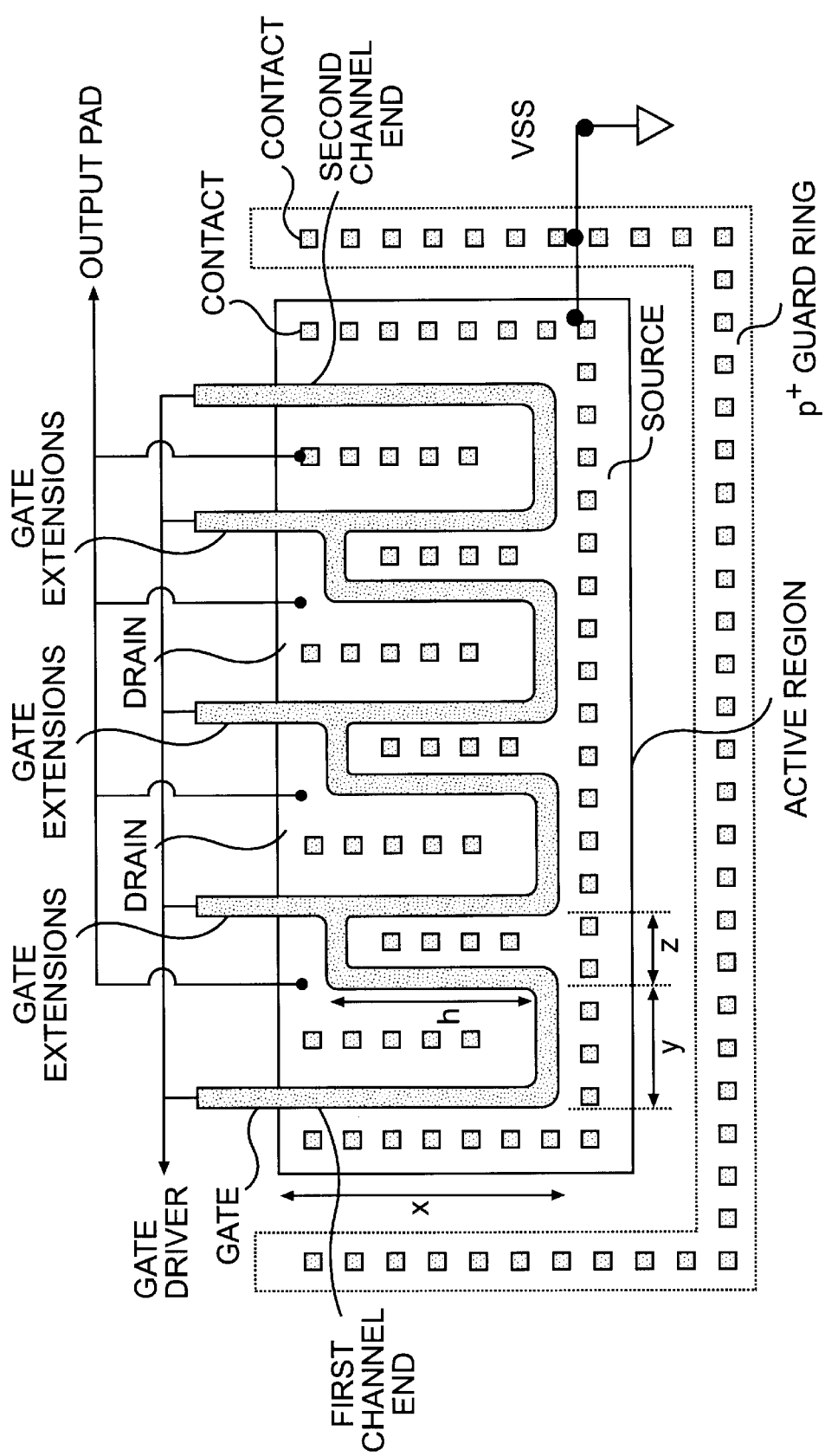
FIG. 6 depicts a second embodiment of the present invention.

A second embodiment of the present invention (FIG. 6) positions the multiple gate extensions at a corner of the serpentine gate short legs, rather than in the center of the legs, as in the first embodiment (FIG. 1). The minimum spacing between the source and drain diffusion regions is maintained constant around the gate-to-source corner near the gate extension, in order to further enhance the uniform turn on of the entire gate body during an ESD event.

In short, an inventive MOSFET structure is disclosed with improved turn on characteristics during an ESD event. Moreover, the disclosed structure also possesses high propagation speed characteristics desirable for MOSFET applications.

The above described embodiment of the invention is intended to be illustrative only. Numerous alternative embodiments may be devised by those skilled in the art without departing from the spirit and scope of the following claims.

What is claimed is:

1. A MOSFET structure for enhancing uniform poly-gate turn-on during an ESD event, comprising:

an active region in a substrate, a channel formed in said substrate having first and second ends in the channel width direction and a serpentine shaped layout between said first and second ends, drain and source diffusion regions within said active region, said drain and source diffusion regions being interdigitated, and being separated by said serpentine channel, such that an edge between said serpentine channel and said source diffusion is continuous between said first and second ends, and a continuous poly-gate, including a serpentine poly-gate active portion interposed between said source and drain diffusion regions, and covering said continuous serpentine channel between said first and second ends, said poly-gate active portion having multiple poly-gate extensions disposed between said first and second ends, wherein said multiple poly-gate extensions are connected at one of said rounded corners of said short legs of said poly-gate active portion, wherein the minimum spacing between said source and said drain diffusion regions is constant around said rounded corner of said short leg not connected to said multiple poly-gate extensions.

2. A MOSFET structure for enhancing uniform poly-gate turn-on during an ESD event, comprising:

an active region surrounded by an isolation region;

a plurality of first doped regions of a first impurity type and a common second doped region of said first impurity type within said active region;

a continuous gate body within said active region providing a continuous gate-to-second-doped-region edge throughout the active region and a discontinuous gate-to-first-doped-region edge throughout the active region; and said discontinuous gate-to-first-doped-region edge having at least one discontinuity where at least one gate extension element is connected from the gate body to the isolation region, each at least one gate extension element separating each of said plurality of first doped regions, wherein a first distance from said gate body to a first contact in one of said plurality of first doped regions being larger than a second distance from said gate body to a second contact in said second doped region.

3. The MOSFET structure of claim 2, wherein each of said at least one gate extension element comprises a polysilicon gate over a thin gate oxide.

4. The MOSFET structure of claim 2, wherein each of said at least one gate extension element comprises a polysilicon gate over at least a portion of a thin gate oxide.

5. The MOSFET structure of claim 2, wherein said isolation region is a field oxide region.

6. The MOSFET structure of claim 2, wherein said continuous gate body and said at least one gate extension are electrically connected to a gate-drive signal, and each of said plurality of first doped regions of said MOSFET is connected to a bond pad.

7. The MOSFET structure of claim 2, wherein said MOSFET is an NMOSFET and said continuous gate body, said at least one gate extension element, and said second doped region are electrically connected to ground.

8. The MOSFET structure of claim 7, wherein at least one of said plurality of first doped regions is electrically connected to a bond pad.

9. The MOSFET structure of claim 7, wherein at least one of said plurality of first doped regions is electrically connected to a VDD bus.

10. The MOSFET structure of claim 7, wherein said continuous gate body and said at least one gate extension element are electrically connected to ground through a resistor and electrically coupled to at least one of said plurality of first doped regions through a capacitor.

11. The MOSFET structure of claim 2, wherein said MOSFET is a PMOSFET and said continuous gate body, said at least one gate extension element, and said second doped region are electrically connected to a VDD bus.

12. The MOSFET structure of claim 2, wherein the diffusion edges within said active region cascade a snap-back mode along said active portion of said continuous gate body, such that the entire said active portion of said continuous gate body turns on during an ESD event.

13. The MOSFET structure of claim 2, wherein said continuous gate body, in association with inherent RC delays, causes suppression of noise signals when said MOSFET is used as a high current-drive output buffer.

14. The MOSFET structure of claim 2, wherein said continuous gate body has rounded corners in said active region to prevent an electric field crowding effect.

15. An MOS structure for improving electrostic discharge protection, comprising:

an action region, a continuous gate body within said active region disposed between a common source diffusion region and an array of separated drain diffusion regions;

an array of at least one extension element extending from said gate body for dividing at least two adjacent ones of said drain diffusion regions; and a continuous gate-to-source diffusion edge, wherein said continuous gate-to-source diffusion edge cascade a snap-back mode along the gate body within said active region during an ESD event, wherein a first distance from said gate body to a first contact in one of said plurality of first doped regions being larger than a second distance from said gate body to a second contact in said second doped region.

16. The MOS structure of claim 15, wherein said gate body comprises a serpentine shaped portion.

17. The MOS structure of claim 15, wherein said at least one extension element extends from said gate body to a field oxide region surrounding said active region.

18. The MOS structure of claim 15, wherein said continuous poly-gate and said multiple poly-gate extensions are electrically connected to a gate-drive signal, and at least one drain diffusion region of said MOS structure is connected to a bond pad.

19. The MOS structure of claim 15, wherein said MOS is an NMOSFET and said continuous gate body, said at least one extension element, and said source diffusion region are electrically connected to ground.

20. The MOS structure of claim 19, wherein said at least one drain diffusion region is electrically connected to a bond pad.

21. The MOS structure of claim 19, wherein said at least one drain diffusion region is electrically connected to a VDD bus.

22. The MOS structure of claim 19, wherein said continuous gate body and said at least one extension element are electrically connected to ground through a resistor and electrically coupled to said at least one drain diffusion region through a capacitor.

23. The MOS structure of claim 15, wherein said MOS is a PMOSFET and said continuous gate body and said at least one extension element and said source diffusion region are electrically connected to a VDD bus.

24. The MOS structure of claim 15, wherein said continuous diffusion edges within said active region cascade a snap-back mode along said active portion of said continuous gate body element, such that the entire said active portion of said continuous gate body element turns on during an ESD event.

25. The MOS structure of claim 15, wherein said continuous gate body element, in association with inherent RC delays, causes suppression of noise signals when said MOS is used as a high current-drive output buffer.

26. The MOS structure of claim 15, wherein said continuous gate body element has rounded corners in said active region to prevent an electric field crowding effect.

27. An ESD protection device, comprising, an active region;

a continuous channel region within said active region disposed between a common second diffusion region and an array of first diffusion regions;

an array of at least one extension element extending from said channel region for dividing at least two adjacent ones of said array of first diffusion region; and a continuous channel-to-second-diffusion-region edge, wherein said continuous channel-to-second diffusion edge cascades a snap-back mode along the continuous channel region within said active region during an ESD event, wherein a first distance from said gate body to a first contact in one of said plurality of first doped regions being larger than a second distance from said gate body to a second contact in said second doped region.

28. The ESD protection device of claim 27, wherein said channel region comprises a serpentine shaped portion.

29. The ESD protection device of claim 27, wherein said at least one extension element extends from said gate body to a field oxide region surrounding said active region.

30. The ESD protection device of claim 27, wherein at least one of said plurality of first doped regions is electrically connected to a bond pad.

31. The ESD protection device of claim 27, wherein at least one of said plurality of first doped regions is electrically connected to a VDD bus.

32. The ESD protection device of claim 27, wherein said continuous channel region and said at least one extension element are electrically connected to ground through a resistor and electrically coupled to at least one of said plurality of first doped regions through a capacitor.

33. The ESD protection device of claim 27, wherein said continuous channel region has rounded comers in said active region to prevent an electric field crowding effect.

34. A MOSFET structure for enhancing uniform poly-gate turn-on during an ESD event, comprising:

an active region in a substrate, a channel formed in said substrate having first and second ends in the channel width direction and a serpentine shaped layout between said first and second ends, a continuous first diffusion region and an array of second diffusion regions within said active region, said first and said array of second diffusion regions being interdigitated, and being separated by said serpentine channel, such that an edge between said serpentine channel and said first diffusion region is continuous between said first and second ends, wherein at least in one direction, a width of one of said array of second diffusion regions being substantially larger than a width of said interdigitated first diffusion region, and a continuous poly-gate, including a serpentine poly-gate active portion interposed between said first and said array of said second diffusion regions, and covering said continuous serpentine channel between said first and second ends, said poly-gate active portion having multiple poly-gate extensions disposed between said first and second ends and between said array of second diffusion regions.

35. The MOSFET structure of claim 34, wherein said continuous poly-gate and said multiple poly-gate extensions are electrically connected to a gate-drive signal, and the drain of said MOSFET is connected to a bond pad.

36. The MOSFET structure of claim 34, wherein said MOSFET is an NMOSFET and said continuous poly-gate and said multiple poly-gate extensions and said source are electrically connected to ground.

37. The MOSFET structure of claim 36, wherein said drain is electrically connected to a bond pad.

38. The MOSFET structure of claim 36, wherein said drain is electrically connected to a VDD bus.

39. The MOSFET structure of claim 36, wherein said continuous poly-gate and said multiple poly-gate extensions are electrically connected to ground through a resistor and electrically coupled to said drain through a capacitor.

40. The MOSFET structure of claim 34, wherein said MOSFET is a PMOSFET and said continuous poly-gate and said multiple poly-gate extensions and said source are electrically connected to a VDD bus.

41. The MOSFET structure of claim 34, wherein said continuous diffusion edges within said active region cascade a snap-back mode along said active portion of said continuous polygate element, such that the entire said active portion of said continuous poly-gate element turns on during an ESD event.

42. The MOSFET structure of claim 34, wherein said continuous poly-gate element, in association with inherent RC delays, causes suppression of noise signals when said MOSFET is used as a high current-drive output buffer.

43. The MOSFET structure of claim 34, wherein said continuous poly-gate element has rounded comers in said active region to prevent an electric field crowding effect.

44. The MOSFET structure of claim 34, wherein a distance from the channel edge to a source diffusion contract is shorter than a distance from the channel edge to a drain diffusion contact.

45. The MOSFET structure of claim 34, wherein said first diffusion region provides a channel-to-source diffusion edge and said array of second diffusion regions provides a respective array of channel-to-drain diffusion edges.

46. An MOS structure for improving electrostatic discharge protection (ESD), comprising:

an active region, a continuous gate body within said active region, disposed between a common source region and at lease one drain region;

a continuous gateto-source edge between the gate body and the common source region;

a plurality of gate-to-drain edges between the gate body and said at least one drain region;

a first distance from said gate body to a first contact in said at least one drain region, where said first distance being larger than a second distance from said gate body to a second contact in said source region, wherein said continuous gate-to-source edge cascade a snap-back action along the active gate body within said active region during an ESD event.

47. The MOS structure of claim 46, further comprising an array of at least one extension element, extending from said gate body into said at least one drain region, for separating at least two of said plurality of gate-to-drain edges.

48. The MOS structure of claim 47, wherein said at least one extension element is configured from substantially the same material as the gate body.

49. The MOS structure of claim 46, wherein said at least one drain region is coupled to a first bond pad.

50. The MOS structure of claim 46, wherein said common source region is coupled to a second bond pad.

51. The MOS structure of claim 46, wherein said at least one drain region includes at least two completely separated drain diffusion regions.

52. An MOS structure for improving electrostatic discharge protection (ESD), comprising:

an active region, a continuous gate body within said active region disposed between a common source region and at least one drain regions where said at least one drain region including at least two adjacent drain diffusion regions proximate to said gate body;

an array of at least one extension element, extending from said gate body into said at least one drain region, for separating said at least two adjacent drain diffision regions;

a continuous gate-to-source edge; and a first distance from said gate body to a first contact in said at least one drain region, where said first distance being larger than a second distance from said gate body to a second contact in said source region;

wherein said continuous gate-to-source edge cascade a snap-back action along the active gate body within said active region during an ESD event.

53. The MOS structure of claim 52, wherein said at least one drain region is coupled to a first bond pad.

54. The MOS structure of claim 52, wherein said common source region is coupled to a second bond pad.

* * * * *